United States Patent
Funahashi et al.

[11] Patent Number: 5,999,833
[45] Date of Patent: Dec. 7, 1999

[54] METHOD FOR PRODUCTION OF SUPERCONDUCTING OXIDE TAPE AND SUPERCONDUCTING OXIDE TAPE PRODUCED THEREBY

[75] Inventors: Ryoji Funahashi, Kobe; Ichiro Matsubara, Minoo; Kazuo Ueno; Hiroshi Ishikawa, both of Ikeda, all of Japan

[73] Assignee: Agency of Industrial Science & Technology, Ministry of International Trade & Industry, Tokyo, Japan

[21] Appl. No.: 09/003,460

[22] Filed: Jan. 6, 1998

[30] Foreign Application Priority Data

Feb. 4, 1997 [JP] Japan .................................... 9-037068

[51] Int. Cl.$^6$ .............................. H01L 39/12; H01L 39/24
[52] U.S. Cl. .......................... 505/230; 505/237; 505/450; 505/236; 505/430; 505/501; 505/704; 428/702; 428/930
[58] Field of Search ..................................... 428/680, 702, 428/930; 29/599; 505/230, 231, 236, 237, 450, 704, 430, 501

[56] References Cited

U.S. PATENT DOCUMENTS

| | | |
|---|---|---|
| 5,242,896 | 9/1993 | Matsubara et al. . |
| 5,354,921 | 10/1994 | Matsubara et al. . |
| 5,661,114 | 8/1997 | Otto et al. ................. 505/501 |
| 5,846,910 | 12/1998 | Funahashi et al. ............. 505/430 |

OTHER PUBLICATIONS

T.G. Holesinger, et al., "Isothermal Melt Processing of Bi–2212 Thick Films", Physica C 243 (1995), pp. 93–102.

T.G. Holesinger, et al., Directional Isothermal Growth of Highly Textured $Bi_2Sr_2CaCu_2O_y$, Applied Physics Letters, vol. 63, No. 7, Aug. 16, 1993, pp. 982–984.

R.D. Ray II, et al., "Synthesis of Ag Sheathed, Bi–2212 Tapes by a Novel Liquid Wicking Method", Physica C 251 (1995), pp. 1–6.

Ryoji Funahashi, et al., "Critical Current Density for $Bi_2Sr_2CaCu_2O_x$/Ag Tapes Prepared Using an Isothermal Partial Melting Method Under Controlled Atmospheres", Physica C 273 (1997) 337–341.

Primary Examiner—Marie Yamnitzky
Assistant Examiner—Hong J. Xu
Attorney, Agent, or Firm—Oblon, Spivak, McClelland, Maier & Nuestadt, P.C.

[57] ABSTRACT

A method for the production of a superconducting oxide tape having a $Bi_2Sr_2Ca_2Cu_3O_{10}$ (Bi-2223) structure interposed between silver sheets, which method consists essentially of preparing a sandwich structure having interposed between silver sheets a molded layer of a superconducting oxide precursor powder consisting essentially of Bi, Pb, Sr, Ca, Cu, and O obtained from a raw material substance composed of, in atomic composition ratio, 1.00 of Bi, 0–0.2 of Pb, 0.9–1.1 of Sr, 0.9–1.1 of Ca and 1.3–1.7 of Cu, and O, heating the sandwich structure in an atmosphere consisting of oxygen and an inert gas, having an oxygen partial pressure in the range of 0–5%, and kept at a temperature in the range of 830–850° C., thereby melting the molded layer, then causing the atmosphere to retain the heating temperature and meanwhile increasing the oxygen partial pressure, thereby inducing precipitation of crystal grains possessing a $Bi_2Sr_2CaCu_2O_8$ (Bi-2212) structure and excelling in orientation, and subsequently maintaining the oxygen partial pressure and temperature at the time of precipitation of the crystal grains, thereby transforming the structure into the (Bi-2223) structure while retaining the particle diameter of the crystal grains and the state of orientation, and superconducting oxide tape produced by the method.

10 Claims, 5 Drawing Sheets

METHOD FOR PRODUCTION OF SUPERCONDUCTING OXIDE TAPE AND SUPERCONDUCTING OXIDE TAPE PRODUCED THEREBY

BACKGROUND OF THE INVENTION

1. Field of the Invention

This invention relates to a method for the production of a superconducting oxide tape having a $Bi_2Sr_2Ca_2Cu_3O_{10}$ (Bi-2223) structure and a superconducting oxide tape produced by the method.

2. Description of the Prior Art

Research concerning superconducting oxides has advanced remarkably in both basic and applied fields in recent years. In the basic field, numerous papers have been published regarding the discovery of superconductors of novel compositions, the development of new methods of synthesis, the elucidation of superconduction mechanisms, etc. In the applied field as well, research on applications has expanded over a broad spectrum of materials ranging from electric and electronic materials to therapeutic materials. In numerous fields expectations are high regarding the development of oxide superconducting materials and the exhancement of their functions.

Such nonoxide type superconducting materials as niobium titanium alloys are currently utilized extensively as superconducting substances. Superconducting magnets, exceeding 15 teslas in capacity, are being manufactured with such superconducting substances. Owing to their low critical temperatures, however, these superconductors must be kept cooled with liquid helium, at huge cost of refrigeration.

Some of the superconducting oxide substances have critical temperatures exceeding the critical temperature of liquid nitrogen. If they could be practically applied, they would immensely reduce the cost of refrigeration. Thus, research on utilization of superconducting oxide substances for power storage, power transmission, generation of strong magnetic fields, etc. is being actively promoted. To realize such applications, it is necessary to reduce the superconducting oxide substances to wire rods or tapes.

The superconductor of the $Bi_2Sr_2CaCu_2O_8$ (Bi-2212) structure, one of the Bi type superconductors, is manufactured by the partial melting technique into a tape which exhibits a very high critical current density in liquid helium. The present inventors earlier developed an improved method of producing a tape of the $Bi_2Sr_2CaCu_2O_8$ structure based on the method mentioned above and a patent application has been filed thereon (U.S. patent application Ser. No. 08/873, 090 which issued as U.S. Pat. No. 5,846,910). Their invention relating to the production of a superconducting polycrystalline wire rod from superconducting whiskers of the $Bi_2Sr_2CaCu_2O_8$ structure has also been applied for patent (U.S. patent application Ser. No. 08/873,084). Since the critical temperature of the Bi-2212 superconductor is 80–90 K, only slightly different from the temperature of liquid nitrogen, the Bi-2212 superconducting oxide tape is hard to use at the temperature of the liquid nitrogen.

The wire rod of the Bi-2223 superconductor, which has a critical temperature as high as 110 K, has therefore been attracting attention. So far, the partial melting technique has not yet succeeded in producing a wire rod of the Bi-2223 superconductor. The Bi-2223 superconductor wire rod is almost always obtained by the solid-phase sintering technique. Since the Bi-2223 superconductor wire. rod is a polycrystalline substance, the factors thereof such as the intensity of superconducting bond at the grain boundary and the particle diameter of crystals directly affect the critical current density. Specifically, the critical current density rises as the strength of bond at the grain boundary and the size of crystal particles increase. Since the superconductor wire rod produced by the solid-phase sintering technique is limited as regards the superconducting bond intensity and the crystal particle diameter, the improvement thereof in critical current density is likewise limited.

It is the main object of this invention to provide a practical method for the production of a Bi-2223 superconducting oxide wire rod or tape by the partial melting technique.

SUMMARY OF THE INVENTION

The present inventors pursued various studies with a view to solving the problems encountered by the prior art as described above. This invention has been accomplished as a result.

Specifically, this invention is directed to a method for the production of a superconducting oxide tape having a $Bi_2Sr_2Ca_2Cu_3O_{10}$ (Bi-2223) structure interposed between silver sheets, which method consists essentially of preparing a sandwich structure having interposed between silver sheets a molded layer of a superconducting oxide precursor powder consisting essentially of Bi, Pb, Sr, Ca, Cu, and O obtained from a raw material substance composed of, in atomic composition ratio, 1.00 of Bi, 0–0.2 of Pb, 0.9–1.1 of Sr, 0.9–1.1 of Ca and 1.3–1.7 of Cu, and O, heating the sandwich structure in an atmosphere consisting of oxygen and an inert gas, having an oxygen partial pressure in the range of 0–5%, and kept at a temperature in the range of 830–850° C., thereby melting the molded layer, then causing the atmosphere to retain the heating temperature and meanwhile increasing the oxygen partial pressure, thereby inducing precipitation of crystal grains possessing the $Bi_2Sr_2CaCu_2O_8$ (Bi-2212) structure and excelling in orientation, and subsequently maintaining the oxygen partial pressure and temperature at the time of precipitation of the crystal grains, thereby transforming the structure into the (Bi-2223) structure while retaining the particle diameter of the crystal grains and the state of orientation, and to a superconducting oxide tape produced by this method, which tape has interposed between silver sheets a superconducting oxide of the $Bi_2Sr_2Ca_2Cu_3O_{10}$ (Bi-2223) structure and exhibiting a critical current density of at least $10^4$ A/cm$^2$ at 77 K.

The use of only one sandwich structure is not an essential requirement but the use of a plurality of stacked sandwich structures is allowable for the method mentioned above as well as for the superconducting oxide tape produced by this method.

When the partial pressure of oxygen is to be increased for the purpose of inducing precipitation of crystal grains having the $Bi_2SR_2CaCu_2O_8$ (Bi-2212) structure and excelling in orientation after the melting of the molded layer, essentially this increase is preferred to be in the range of 7–20%.

Raw material substances usable for the production of the superconducting oxide precursor powder include oxides of Bi, Pb, Sr, Ca, and Cu or the elements mentioned above in simple form or compounds thereof which are capable of forming the oxides by firing. Specifically, $Bi_2O_3$ may be cited as a Bi source, PbO as a Pb source, $SrCO_3$ as a Sr source, $CaCO_3$ as a Ca source, and CuO as a Ca source, for example.

DESCRIPTION OF THE PREFERRED EMBODIMENTS

Figure 1:
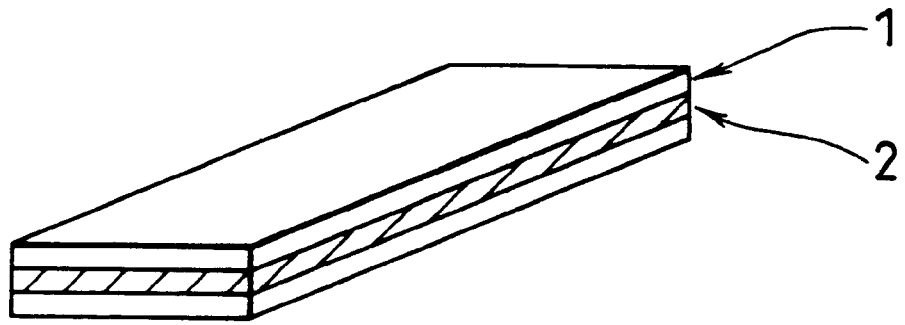
FIG. 1 is a superconducting oxide tape of this invention using two silver sheets and one superconducting oxide layer.

According to this invention superconducting oxide tape enabling the superconducting properties thereof to be controlled over a wide range from a very high level to a low level and possessing superconducting properties necessary for practical uses in various fields can be easily obtained.

The method for the production of a superconducting oxide tape according to this invention utilizes the property that the melting point of a superconducting oxide rises in proportion as the partial pressure of oxygen therein increases. Specifically, this method of production is based on the steps of melting a superconducting oxide precursor powder at a stated temperature and subsequently controlling (heightening) the partial pressure of oxygen while retaining the temperature thereby partially melting the superconducting oxide precursor powder and crystallizing the molten powder.

The method for the production of the superconducting oxide precursor powder to be used for the production of the superconducting oxide tape contemplated by this invention, the method for the production of the superconducting oxide tape of this invention, and the superconducting oxide tape consequently obtained will be described in detail below.

I. Method for Production of Superconducting Oxide Precursor Powder

The superconducting oxide precursor powder to be used as the raw material for the production of the superconducting oxide tape of this invention is obtained by mixing raw material substances comprising 1.00 of Bi, 0–0.2 of Pb, 0.9–1.1 of Sr, 0.9–1.1 of Ca, and 1.3–1.7 of Cu in atomic composition ratio, firing the resultant mixture, and pulverizing the fired mixture. This method of production is known to the art.

The atomic composition ratio of Pb is in the range of 0 to 0.2. Addition of Pb lowers the melting point of the composition and expedites the formation of the Bi-2223 phase.

Though the temperature and duration of the firing of the raw material substance are not particularly defined, the firing is generally carried out at a temperature in the approximate range of 800–850° C. for a period in the approximate range of 10–180 hours. For example, the raw material substance is fired at about 800° C. for about 8 hours,. and then fired at about 843° C. for about 120 hours. The raw material substance is subjected to no particular restriction but requires only to be capable of forming an oxide by firing. Simple elements, oxides thereof, or various compounds thereof (such as carbonates) may be used. Compounds which contain two or more of the elements mentioned above may be used. The device used for firing the raw material substance is not particularly defined. Any of the known devices such as, for example, an electric heating furnace or a gas heating furnace, may be used.

II. Method for Production of Superconducting Oxide Tape

A molded layer of the superconducting oxide precursor powder produced by the method described above is obtained by suspending this precursor powder in an organic solvent, applying the resultant suspension to a silver sheet substrate, preliminarily drying the resultant superposed layers thereby forming a layer of powder on the silver sheet substrate, then overlaying another silver sheet on the powder layer, and pressing the resultant sandwich structure thereby causing the powder layer to acquire a uniform thickness. The organic solvent used in this case is not particularly limited but requires only to avoid reacting with the superconducting oxide precursor powder. Concrete examples of the organic solvent effectively usable herein include ethyl alcohol, α-terpineol, toluene, and hexane. These organic solvents may be used in the form of a mixture or two or more. As a specific example, a mixed solution consisting of ethyl alcohol and α-terpineol at a volumetric ratio of 1:1 may be cited.

Since the silver sheet mentioned above is not particularly restricted regarding length, width, and shapes the superconducting oxide tape can be manufactured in arbitrary size and shape.

Practically, the superconducting oxide tapes measure several cm to some tens of m in length, about several mm in width, and not more than 500 $\mu$m in thickness.

Figure 2:
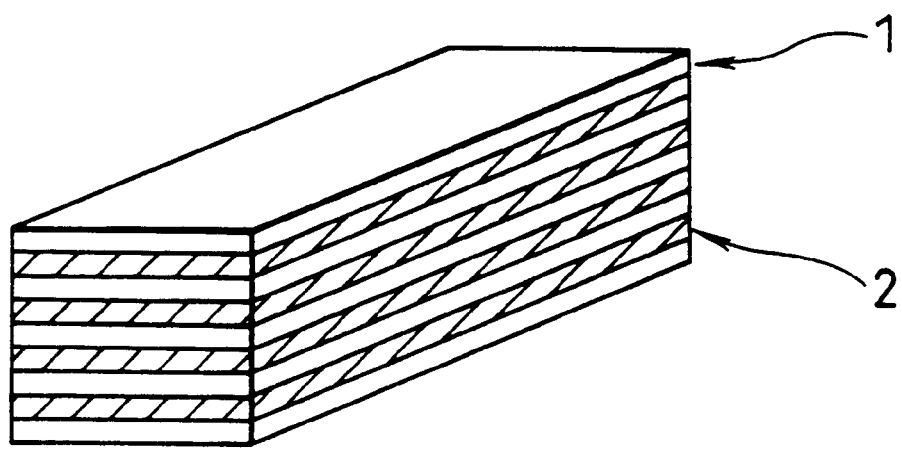
FIG. 2 is a superconducting oxide tape of this invention using five silver sheets and four superconducting oxide layers.

The molded layer (obtained by forming the superconducting oxide precursor powder) does not need to be a single layer but may consists of a plurality of such formed layers superposed through the medium of silver sheets. A structure in which n (n$\geq$2) silver sheets and (n–1) formed layers are alternately superposed is also embraced by this invention. FIG. 1 shows a superconducting oxide tape of this invention produced by such alternate superposition where n=2 and FIG. 2 a superconducting oxide tape of this invention similarly produced where n=5. In the diagrams of FIG. 1 and FIG. 2, 1 denotes a silver sheet and 2 a superconducting oxide layer.

The superposed structure formed of sheets and formed layers as mentioned above is set in position within a heating furnace and heated therein at a temperature in the range of 300–500° C. for a period in the range of 1–5 hours to effect thorough expulsion of the organic solvent. It is subsequently heated under a relatively low partial pressure of oxygen (0–5%) at a temperature in the approximate range of 830–850° C. for a period in the approximate range of 5–60 minutes so as to melt the superconducting oxide precursor powder. Then, the atmosphere is caused to retain the same temperature as during the course of melting and change the partial pressure of oxygen to a higher level (7–20%) to induce precipitation of crystal grains having the $Bi_2Sr_2CaCu_2O_8$ (Bi-2212) structure and excelling in orientation. The crystal grains are subsequently fired under the same partial pressure of oxygen at the same temperature for a period in the range of 300–600 hours to induce formation of superconducting crystal grains of the Bi-2223 structure excelling in orientation. Although the internal pressure of the furnace during the course of melting and during the course of temperature retention is not particularly defined, it does not need to be either increased or decreased but may be retained at one atmosphere. The internal atmosphere of the furnace is a mixture of oxygen with another gas so as to retain the internal pressure of the furnace at a stated level (one atmosphere, for example). The gas other than oxygen is subject to no particular restriction except for the requirement that it be incapable of reacting with either the superconducting oxide or the silver sheets. Any of known gases (such as, for example, nitrogen and rare gases) may be used. In a typical case, the molded layer of the precursor is heated in the air at 500° C. for three hours to remove the organic solvent, then melted under a partial pressure 0% of oxygen (a partial pressure 100% of nitrogen) for five minutes, and subsequently kept at 843° C. for 300 hours in the atmosphere having the partial pressure of oxygen increased to 7% (the partial pressure of nitrogen decreased to 93%).

The device used for the heating is subject to no particular restriction. Any of the known heating devices such as electric heating furnaces and gas heating furnaces may be used.

III. Superconducting Oxide Tape

Figure 3:
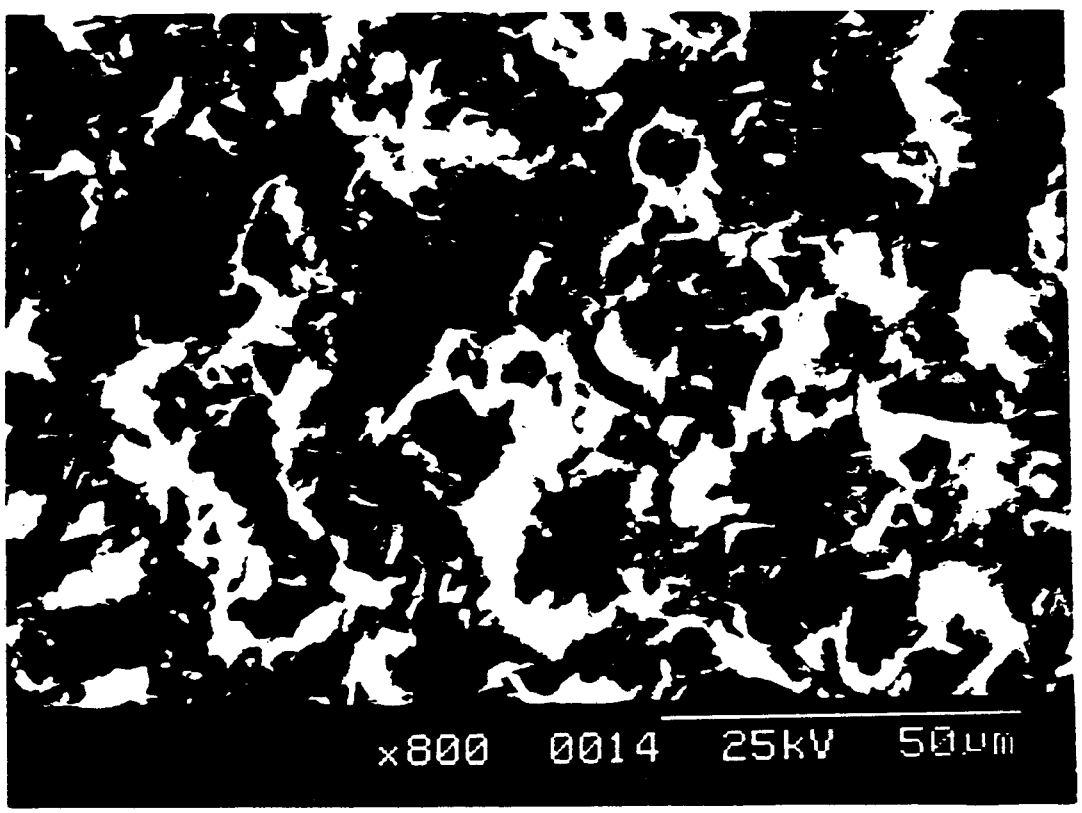
FIG. 3 is a scanning electron micrograph of a superconducting oxide tape of this invention obtained in Example 1.

FIG. 3 shows scanning electron micrograph (SEM) of one example of the superconducting oxide tape obtained by this invention (the product of Example 1 which will be specifically described herein below).

In FIG. 3, the black part represents Bi-2223 crystal grains and the white part represents grain boundaries. From FIG. 3, it can be clearly seen that the superconducting crystal grains of the Bi-2223 structure obtained by this invention attained ample growth to diameters of 30–40 $\mu$m and it is further seen that the crystal grains are oriented to a high degree.

Figure 4:
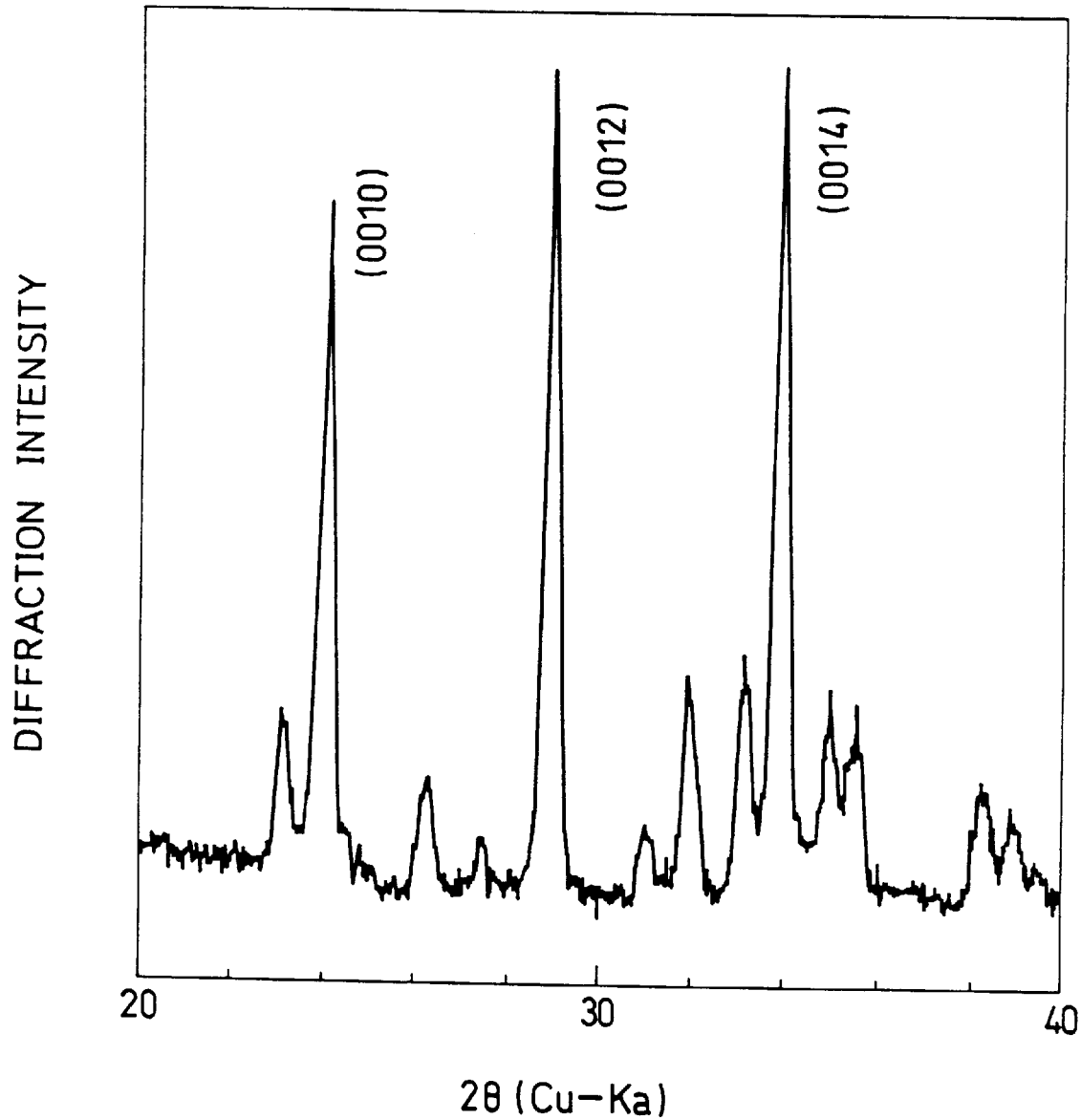
FIG. 4 is a chart showing an X-ray diffraction pattern of a superconducting oxide tape of this invention obtained in Example 1.

The high degree of orientation is evident from the chart of FIG. 4, which shows an X-ray diffraction pattern of the superconducting oxide tape obtained in Example 1. In the chart of FIG. 4, the diffraction peaks of high intensity belong to the Bi-2223 structure and the volumetric ratio of the Bi-2223 crystal grains is not less than 80%. The peak due to the (00n) plane of the 2223 structure appears with particular prominence. This fact implies that the C-axes of the superconducting oxide crystal grains are oriented perpendicularly to the face of the tape.

Figure 5:
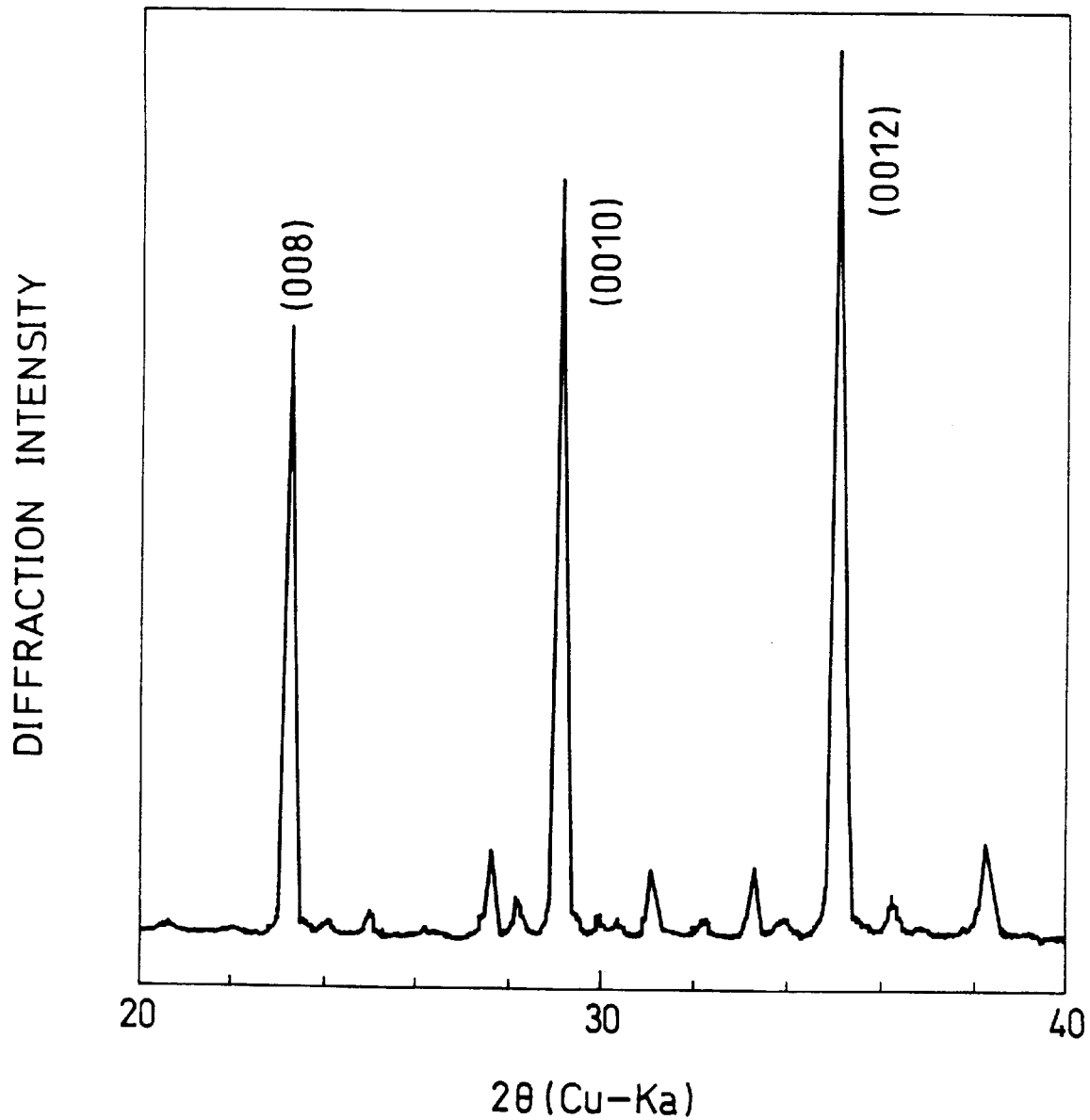
FIG. 5 is a chart showing an X-ray diffraction pattern of a superconducting oxide tape of this invention obtained in Example 12.

FIG. 5 is a chart showing the X-ray diffraction pattern of the superconducting oxide tape obtained in Example 12. The conditions for the procedure of Example 12 were identical to those of Example 1 except that the period for retaining the partial pressure and the temperature after the precipitation of grains was changed from 300 hours to 100 hours. The peak of high intensity is due to the (00n) plane of the Bi-2212 structure. This fact implies that the C-axes of the Bi-2212 crystal grains were oriented perpendicularly to the face of the tape.

In the method of this invention, the Bi-2212 crystal grains are precipitated first from the melt of the precursor powder. As the thermal treatment in process is further continued, the Bi-2212 crystal grains are transformed into the Bi-2223 crystal grains. That is to say, the Bi-2212 crystal grains which are a precursory substance of the Bi-2223 crystal grains are first precipitated from the molded layer of powder in the partially molten state, then subjected gradually to growth of grains and high orientation, and thereafter in consequence of the subsequent firing, transformed into the Bi-2223 crystal grains with the diameter of the crystal grains and the state of orientation retained. As a result, the space between the silver sheets of the tape is filled with grown Bi-2223 crystal grains of high orientation.

During the process of the transformation from the Bi-2212 crystal grains to the Bi-2223 crystal grains, the Ca and Cu ions must be diffused in the solid phase formed by the Bi-2212 crystal grains. For this diffusion, the crystal grains must be retained at a suitable temperature for a long time.

The conventional partial melting technique which effects crystallization of the partially molten molded layer of powder by gradual cooling is incapable of producing a superconducting oxide tape possessing a Bi-2223 structure free from impurity because the firing temperature falls below a level suitable for the diffusion of Ca and Cu ions before the transformation from the Bi-2212 structure to the Bi-2223 structure is completed. In contrast, the method of this invention is capable of producing a Bi-2223 superconducting oxide tape possessing a high critical current density because it performs the whole process of heat treatments at a fixed temperature and, therefore, enables the temperature suitable for the transformation of the Bi-2212 structure to the Bi-2223 structure to be retained for a long time.

Figure 6:
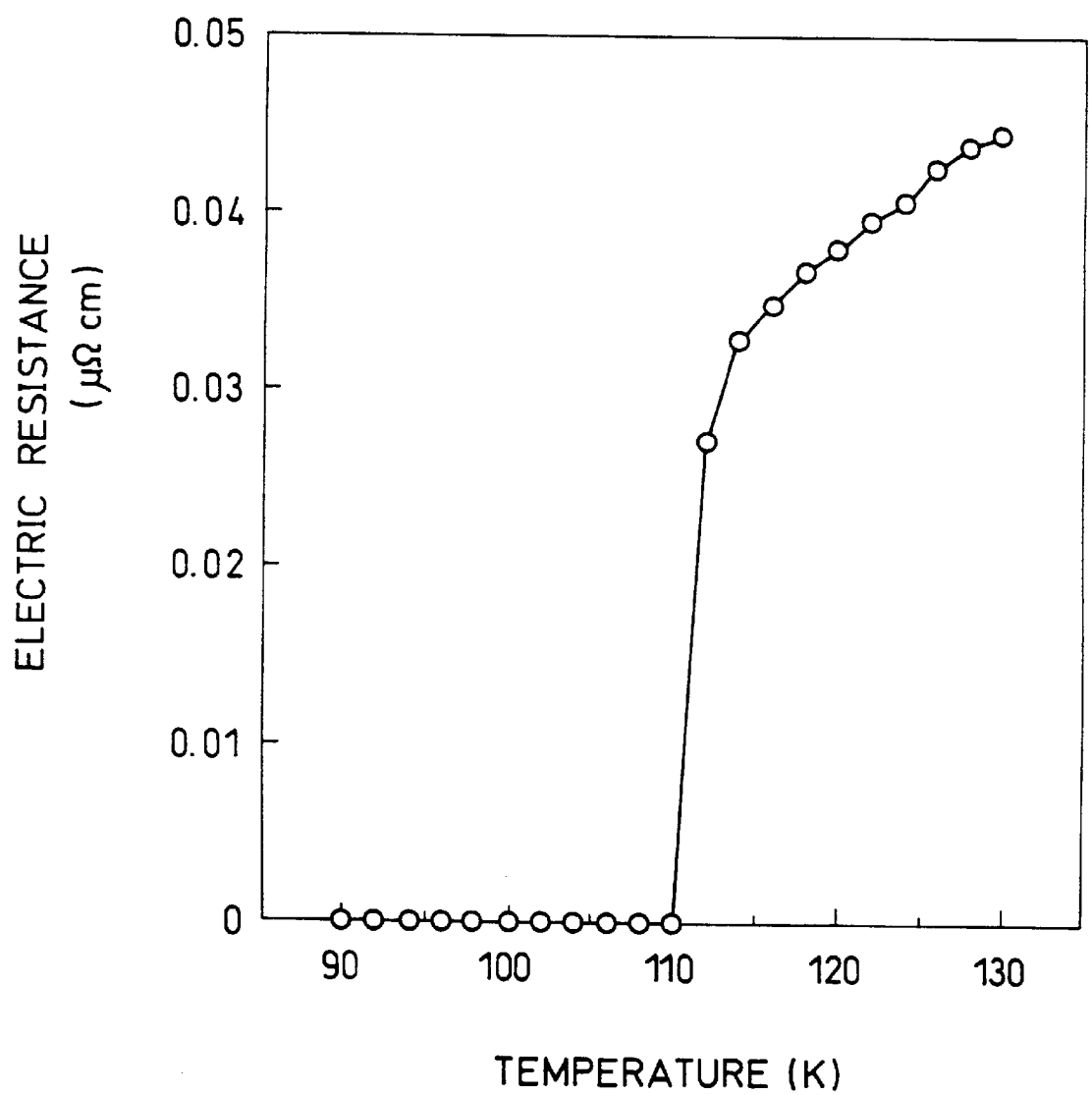
FIG. 6 is a diagram showing the relation between the electric resistance and the absolute temperature determined of a superconducting oxide tape of this invention obtained in Example 1 by the DC four terminal technique.

The relation between the electric resistance and the absolute temperature determined of the superconducting oxide tape of this invention obtained in Example 1 by the DC four terminal technique is shown in FIG. 6. The temperature at which this tape offers absolutely no electric resistance is 110.5 K and the critical current density of the tape at 77 K is as high as $1.2 \times 10^4$ A/cm$^2$.

The method of this invention is capable of producing a superconducting oxide tape comprising Bi-2223 crystal grains and exhibiting a high critical current density by partially melting a superconducting oxide precursor powder composed of Bi, Pb, Sr, Ca, Cu, and O and then crystallizing the resultant partial melt while keeping the temperature thereof at a fixed level and controlling the partial pressure of oxygen.

Since the superconducting oxide tape contemplated by this invention is produced by the melting technique, the superconducting crystal grains of the tape have large diameters and are ideally oriented. Further, this tape exhibits a high critical current density of not less than $10^4$ A/cm$^2$ at 77 K because the crystal grain boundaries thereof exhibit a strong superconducting bond.

The superconducting oxide tape which is obtained according to this invention can be formed in an arbitrary shape during the process of molding under pressure and then fired safely and, therefore, is useful for such high critical temperature superconducting materials as materials for power transmission, materials for power storage, coils for superconductor magnets, and magnetic shield materials.

EXAMPLES

Working examples of this invention will be described below for further clarifying the characteristics of this invention.

Example 1

A starting material formulated to have the ratios of Pb=0.2, Sr=1.1, Ca=1.1, and Cu=1.7 based on Bi=1.00 was thoroughly mixed. The resultant mixture was, placed in an alumina crucible, then fired at 800° C. for eight hours an electric furnace, pulverized, formed under pressure, and fired at 843° C. for 120 hours. Then, the resultant was thoroughly pulverized to prepare a superconducting oxide precursor powder.

Subsequently, this superconducting oxide precursor powder was suspended in a mixed solvent consisting of ethyl alcohol and α-terpineol at a volumetric ratio of 1:1 and thoroughly mixed. The resultant mixture was applied to a silver sheet, 20 mm in length, 2.0 mm in width, and 150 $\mu$m in thickness, and then dried to expel the mixed solvent. Another silver sheet of the same size was superposed on the dried layer of the mixture and the superposed layers were compressed to obtain a sandwich structure having a molded layer of the superconducting oxide precursor powder interposed between the silver sheets.

The resultant sandwich construction was maintained at 500° C. for three hours to remove the organic solvent and then maintained at 843° C., with the partial pressure of the produced tapes are shown in Table 1. Table 1 also shows the conditions and the results obtained in Example 1.

| Example No. | Powder composition (Mixing ratio) Bi:Pb:Sr:Ca:Cu | Firing temperature (° C.) | Partial pressure of oxygen (%) and duration (min) of melting step | Partial pressure of oxygen (%) and duration (min) of crystallizing step | Critical current density (77K) (A/cm$^2$) |
|---|---|---|---|---|---|
| 1 | 1.0:0.2:1.1:1.1:1.7 | 843 | 0 / 5 | 7 / 300 | $1.2 \times 10^4$ |
| 2 | 1.0:0.2:1.1:1.1:1.7 | 843 | 0 / 5 | 7 / 600 | $3.0 \times 10^4$ |
| 3 | 1.0:0.2:1.1:1.1:1.7 | 835 | 0 / 5 | 7 / 300 | $1.2 \times 10^4$ |
| 4 | 1.0:0.2:1.1:1.1:1.7 | 855 | 5 / 60 | 30 / 600 | $1.0 \times 10^4$ |
| 5 | 1.0:0.2:1.1:1.1:1.7 | 850 | 5 / 30 | 20 / 600 | $1.1 \times 10^4$ |
| 6 | 1.0:0.0:0.9:0.9:1.3 | 843 | 0 / 5 | 7 / 300 | $1.1 \times 10^4$ |
| 7 | 1.0:0.0:1.1:1.1:1.7 | 850 | 0 / 5 | 7 / 300 | $1.2 \times 10^4$ |
| 8 | 1.0:0.2:0.9:0.9:1.3 | 830 | 0 / 5 | 7 / 300 | $1.1 \times 10^4$ |
| 9 | 1.0:0.1:1.0:1.0:1.5 | 830 | 0 / 5 | 7 / 300 | $1.3 \times 10^4$ |
| 10 | 1.0:0.1:1.0:1.0:1.5 | 843 | 0 / 5 | 7 / 300 | $1.0 \times 10^4$ |
| 11 | 1.0:0.1:1.0:1.0:1.5 | 850 | 0 / 5 | 7 / 300 | $1.6 \times 10^4$ |
| 12 | 1.0:0.2:1.1:1.1:1.7 | 843 | 0 / 5 | 7 / 100 | | oxygen set at 0% (the partial pressure of nitrogen at 100%), for five minutes to melt the superconducting oxide precursor and induce precipitation of crystal grains possessing a $Bi_2Sr_2CaCu_2O_8$ (Bi-2212) structure and excelling in orientation. The crystal grains, with the surrounding atmosphere kept at the same temperature as before and the partial pressure of oxygen therein changed to 7% (the partial pressure of nitrogen to 93%), were fired for 300 hours. As a result, the crystal grains were transformed into the (Bi-2223) structure, with the particle diameter and the state of orientation thereof retained. The superconducting oxide tape of this invention was consequently obtained.

The superconducting oxide tape consequently produced with a single superconducting oxide layer measured 20 mm in length, 1.5 mm in width, and 300 μm in thickness.

The following raw materials were used for the production of superconducting oxide tape in the present and following examples.

Bi source: Bismuth oxide ($Bi_2O_3$)
Pb source: Lead oxide (PbO)
Sr source: Strontium carbonate ($SrCO_3$)
Ca source: Calcium carbonate ($CaCO_3$)
Cu source: Copper oxide (CuO)

Examples 2–12

Superconducting oxide tapes according to this invention were produced by following the procedure of Example 1 while varying the composition of superconducting oxide precursory powder, the firing temperatures (the temperature for melting the raw material and the temperature for crystallizing the precursor powder), the partial pressure of oxygen during the melting step and the duration of retention thereof, and the partial pressure of oxygen during the crystallizing step and the duration of retention thereof. The conditions of production and the critical current densities of

What is claimed is:

1. A method for the production of a superconducting oxide tape having a $Bi_2Sr_2Ca_2Cu_3O_{10}$ (Bi-2223) structure interposed between silver sheets, which method consists essentially of preparing a sandwich structure having interposed between silver sheets a molded layer of a superconducting oxide precursor powder consisting essentially of Bi, Pb, Sr, Ca, Cu, and O obtained from a raw material substance composed of, in atomic composition ratio, 1.00 of Bi, 0–0.2 of Pb, 0.9–1.1 of Sr, 0.9–1.1 of Ca and 1.3–1.7 of Cu, and O, heating said sandwich structure in an atmosphere consisting of oxygen and an inert gas, having an oxygen partial pressure in the range 0–5%, and kept at a temperature in the range of 830–850° C., thereby melting said molded layer, then causing said atmosphere to retain said heating temperature and meanwhile increasing said oxygen partial pressure, thereby inducing precipitation of crystal grains possessing a $Bi_2Sr_2CaCu_2O_8$ (Bi-2212) structure and excelling in orientation, and subsequently maintaining said oxygen partial pressure and temperature at the time of precipitation of said crystal grains, thereby transforming said structure into said (Bi-2223) structure while retaining the particle diameter of said crystal grains and the state of orientation.

2. A method according to claim 1, wherein said sandwich structure comprises at least three silver sheets and said molded layer between each adjacent pair of said sheets.

3. A method according to claim 1, wherein the heating temperature used during the melting said molded layer is subsequently retained and the partial pressure of oxygen in said atmosphere is meanwhile increased to 7–20%.

4. A method according to claim 1, wherein said raw material substance comprises
   a Bi source selected from Bi, an oxide of Bi and a compound of Bi capable of forming a Bi oxide by firing;
   a Pb source selected from Pb, an oxide of Pb and a compound of Pb capable of forming a Pb oxide by firing;

a Sr source selected from Sr, an oxide of Sr and a compound of Sr capable of forming a Sr oxide by firing;

a Ca source selected from Ca, an oxide of Ca and a compound of Ca capable of forming a Ca oxide by firing; and a Cu source selected from Cu, an oxide of Cu and a compound of Cu capable of forming a Cu oxide by firing.

5. A method according to claim 4, wherein said Bi source of said raw material substance is $Bi_2O_3$, said Pb source thereof is PbO, said Sr source thereof is $SrCO_3$, said Ca source thereof is $CaCO_3$, and said Cu source thereof is CuO.

6. A superconducting oxide tape having a superconducting oxide of a $Bi_2Sr_2Ca_2Cu_3O_{10}$ (Bi-2223) structure interposed between silver sheets and exhibiting a critical current density of at least $10^4$ A/cm$^2$ at 77 K, produced by a method which consists essentially of preparing a sandwich structure having interposed between silver sheets a molded layer of a superconducting oxide precursor powder consisting essentially of Bi, Pb, Sr, Ca, Cu, and O obtained from a raw material substance composed of, in atomic composition ratio, 1.00 of Bi, 0–0.2 of Pb, 0.9–1.1 of Sr, 0.9–1.1 of Ca and 1.3–1.7 of Cu, and O, heating said sandwich structure in an atmosphere consisting of oxygen and an inert gas, having an oxygen partial pressure in the range of 0–5%, and kept at a temperature in the range of 830–850° C., thereby melting said molded layer, then causing said atmosphere to retain said heating temperature and meanwhile increasing said oxygen partial pressure, thereby inducing precipitation of crystal grains possessing a $Bi_2Sr_2CaCu_2O_8$ (Bi-2212) structure and excelling in orientation, and subsequently maintaining said oxygen partial pressure and temperature at the time of precipitation of said crystal grains, thereby transforming said structure into said (Bi-2223) structure while retaining the particle diameter of said crystal grains and the state of orientation.

7. A superconducting oxide tape according to claim 6, wherein said sandwich structure comprises at least three silver sheets and said molded layer between each adjacent pair of said sheets.

8. A superconducting oxide tape according to claim 6, wherein the heating temperature used during the melting said molded layer is subsequently retained and the partial pressure of oxygen in said atmosphere is meanwhile increased to 7–20%.

9. A superconducting oxide tape according to claim 6, wherein said raw material substance comprises a Bi source selected from Bi, an oxide of Bi and a compound of Bi capable of forming a Bi oxide by firing;

a Pb source selected from Pb, an oxide of Pb and a compound of Pb capable of forming a Pb oxide by firing;

a Sr source selected from Sr, an oxide of Sr and a compound of Sr capable of forming a Sr oxide by firing;

a Ca source selected from Ca, an oxide of Ca and a compound of Ca capable of forming a Ca oxide by firing; and a Cu source selected from Cu, an oxide of Cu and a compound of Cu capable of forming a Cu oxide by firing.

10. A superconducting oxide tape according to claim 9, wherein said Bi source of said raw material substance is $Bi_2O_3$, said Ca source thereof is $CaCo_3$, and said Cu source thereof is Cuo.

* * * * *